United States Patent
Hamilton et al.

(10) Patent No.: US 6,277,690 B1
(45) Date of Patent: Aug. 21, 2001

(54) ELIMINATION OF N+ IMPLANT FROM FLASH TECHNOLOGIES BY REPLACEMENT WITH STANDARD MEDIUM-DOPED-DRAIN (MDD) IMPLANT

(75) Inventors: Darlene Hamilton; Len Toyoshiba, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/708,982

(22) Filed: Nov. 2, 2000

(51) Int. Cl.[7] .............................. H01L 21/8247
(52) U.S. Cl. ................................. 438/258
(58) Field of Search ...................... 438/257–267

(56) References Cited

U.S. PATENT DOCUMENTS

| | | |
|---|---|---|
| 5,183,773 * | 2/1993 | Miyata . |
| 5,292,681 * | 3/1994 | Lee et al. . |
| 5,933,730 * | 8/1999 | Sun et al. .............................. 438/258 |
| 6,004,843 * | 12/1999 | Huang .................................. 438/241 |
| 6,037,222 * | 3/2000 | Huang et al. ......................... 438/257 |
| 6,069,033 * | 5/2000 | Verhaar et al. ....................... 438/201 |

* cited by examiner

Primary Examiner—Richard Booth
(74) Attorney, Agent, or Firm—H. Donald Nelson (57) ABSTRACT

A method of manufacturing a semiconductor device that eliminates the N+ implant by replacement with resist spacers on n-channel gate structures and a standard Mdd implant. The N+ implant is thereby eliminated from the n-channel transistors and is replaced by an Mdd implant. The Mdd implant is simultaneously implanted into the core transistors and portions of the n-channel transistors unprotected by the resist spacers. The p-channel transistors are then implanted with a PLdd implant, the n-channel transistors are then planted with an NLdd implant, sidewall spacers are formed on all gate structures, the p-channel transistors are implanted with a P+ implant and the N+ and P+ contacts are then formed.

2 Claims, 15 Drawing Sheets

ELIMINATION OF N+ IMPLANT FROM FLASH TECHNOLOGIES BY REPLACEMENT WITH STANDARD MEDIUM-DOPED-DRAIN (MDD) IMPLANT

BACKGROUND OF THE INVENTION

1. Field of the Invention

This invention relates generally to the manufacture of high density, high performance semiconductor devices. More specifically, this invention relates to the manufacture of high density, high performance semiconductor devices utilizing a reduced number of steps during the manufacturing process.

2. Discussion of the Related Art

In order to remain competitive, a semiconductor manufacture must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of devices per unit area on an integrated circuit chip. Another part of reducing the cost of a semiconductor chip is to increase the throughput of the fabrication facility (the "fab").

A single semiconductor chip requires numerous process steps such as oxidation, etching, metallization and wet chemical cleaning. Some of these process steps involve placing the wafer on which the semiconductor chips are being manufactured into different tools during the manufacturing process. As can be appreciated, a reduction in the number of process steps in which the semiconductor wafers must be moved from one tool to another can be a major increase in the throughput of the fabrication facility as well as a major decrease in the cost of manufacturing the chips on the semiconductor wafer.

Therefore, what is needed are methods of reducing the number of processing steps necessary to manufacture semiconductor wafers on which semiconductor integrated chips are manufactured.

SUMMARY OF THE INVENTION

According to the present invention, the foregoing and other objects and advantages are obtained by a method of manufacturing a semiconductor memory device that reduces the number of manufacturing steps required to manufacture the device.

In accordance with an aspect of the invention, the method includes the following sequence of steps: forming gate structures on a semiconductor substrate in regions in which core, n-channel and p-channel transistors are to be formed in the semiconductor substrate; forming resist spacers on the n-channel transistor gate and implanting the core transistor region and n-channel transistor region with an Mdd implant; implanting the p-channel transistor regions with a PLdd implant; implanting the n-channel transistor regions with an NLdd implant; forming sidewall spacers on the gate structures; implanting the p-channel transistor regions with a P+ implant; and forming N+ and P+ contacts. The combination of this sequence of steps with the formation of the resist spacers allow the following standard process steps to be skipped: the formation of the N+ implant resist coat step; the N+ implant masking step; and the N+ implant step.

The described method thus reduces the number of manufacturing steps required to manufacture a semiconductor device.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode or modes presently contemplated by the inventors for practicing the invention.

Figure 1:
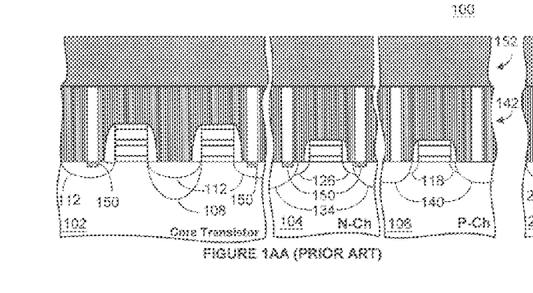
Figure 1A:
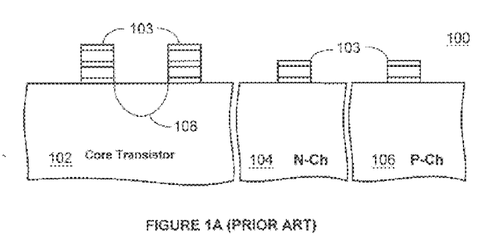
FIGS. 1A–1AD show a number of the process steps necessary to manufacture a semiconductor wafer in accordance with the prior art.
Figure 2:
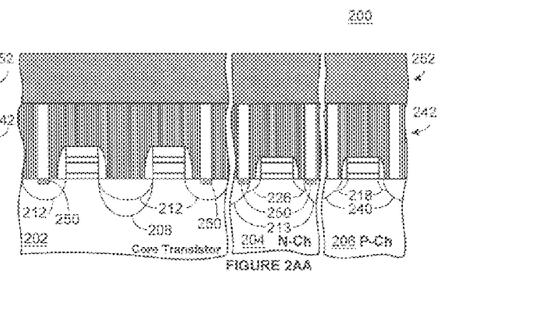
Figure 2A:
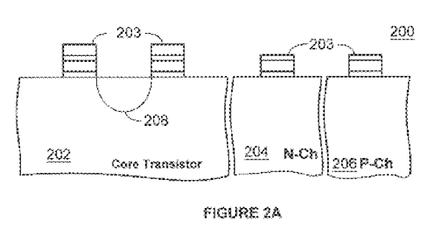
FIGS. 2A–2AD show the reduced number of process steps in accordance with the present invention that are necessary to manufacture the semiconductor wafer processed in the prior art process shown in FIGS. 1A–1AD.

FIGS. 1A–1AD show a number of the process steps necessary to manufacture a semiconductor wafer in accordance with the prior art, and FIGS. 2A–2AD show the reduced number of process steps in accordance with the present invention that are necessary to manufacture the semiconductor wafer processed in the process shown in FIGS. 1A–1AD.

The prior art process steps shown in FIGS. 1A–1AD will be discussed in conjunction with the process shown in FIGS. 2A–2AD in accordance with the present invention in order to clearly point out which process steps have been modified or eliminated.

FIG. 1A shows a portion 100 of a partially completed prior art semiconductor wafer including a core transistor 102 region, an n-channel transistor 104 region and a p-channel transistor 106 region. A diffused region 108 is shown in the core transistor 102 region. Gate structures 103 are shown formed on the core transistor 102 region, the n-channel transistor 104 region and the p-channel transistor 106 region.

FIG. 2A shows a portion 200 of a partially completed semiconductor wafer manufactured in accordance with the present invention including a core transistor 202 region, an n-channel transistor 204 region and a p-channel transistor 206 region. A diffused region 208 is shown in the core transistor 202 region. Gate structures 203 are shown formed on the core transistor 202 region, the n-channel transistor 204 region and the p-channel transistor 206 region. The formation of gate structures is well known in the art and the methods of forming them will not be discussed.

Figure 1B:
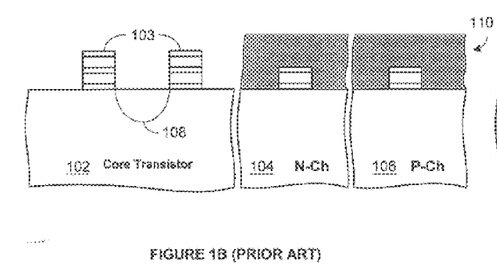

FIG. 1B shows the portion 100 of the partially completed semiconductor wafer as shown in FIG. 1A with a layer 110 of photoresist formed on the wafer and patterned to uncover the core transistor 102 region.

Figure 2B:
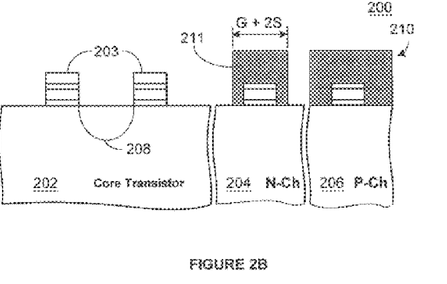

FIG. 2B shows the portion 200 of the partially completed semiconductor wafer as shown in FIG. 2A with a layer 210 of photoresist formed on the wafer and patterned to uncover the core transistor 202 region and has the portion 211 of the layer 210 of photoresist over the n-channel region 204 patterned with the dimensions of the gate formed on region 204 of the substrate on which the n-channel transistor will be formed and with resist spacers formed on either side of the gate. The dimension of the portion 211 of the layer 210 of photoresist is G+2S (dimensions of the gate plus 2 times the dimensions of a resist spacer (one on either side of the gate)). The dimension of the portion 211 of the layer 210 of photoresist (G+2S) determines the length of the channel underlying the n-channel transistor. The dimension G+2S can be selected to be less than an equivalent dimension that can be obtained from a photolithographic system used in a standard process.

Figure 1C:
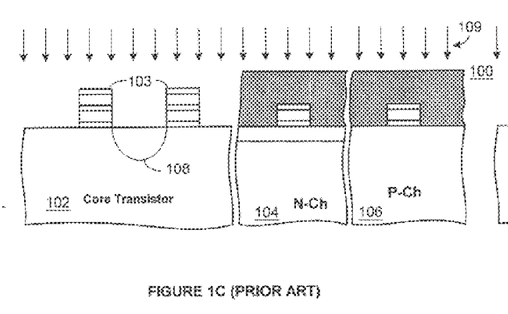

FIG. 1C shows the portion 100 of the partially completed semiconductor wafer as shown in FIG. 1B being implanted with an Mdd (medium-doped-drain) (as is known in the art, a reference to "dd" indicates a "drain" and a "source") implant indicated by arrows 109.

Figure 1D:
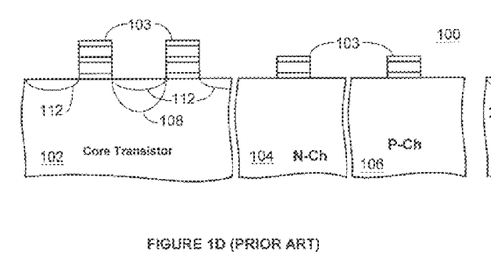
Figure 2C:
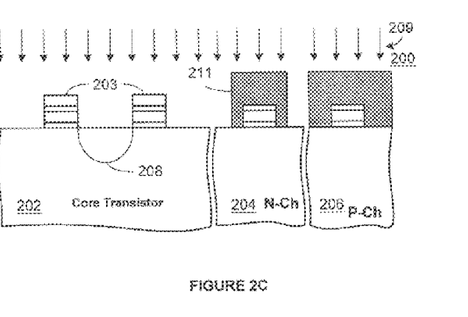

FIG. 2C shows the portion 200 of the partially completed semiconductor wafer as shown in FIG. 2B being implanted with an Mdd implant indicated by arrows 209. The Mdd implant is implanted into the core transistor region 202 and into the n-channel region 204 that is unprotected by the structure 211 that include the resist spacers. FIG. 1D shows the portion 100 of the partially completed semiconductor wafer as shown in FIG. 1C with the layer 110 of photoresist removed and with Mdd regions 112 formed in the core transistor 102 region.

Figure 2D:
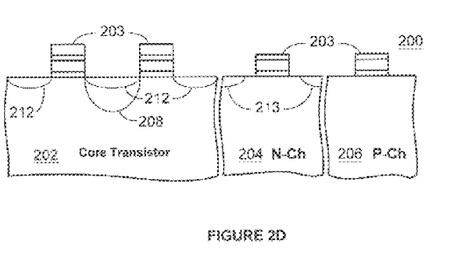

FIG. 2D shows the portion 200 of the partially completed semiconductor wafer as shown in FIG. 2C with the layer 210 of photoresist removed and with Mdd regions 212 formed in the core transistor 202 region and with Mdd regions 212 formed in the n-channel 204 region.

Figure 1E:
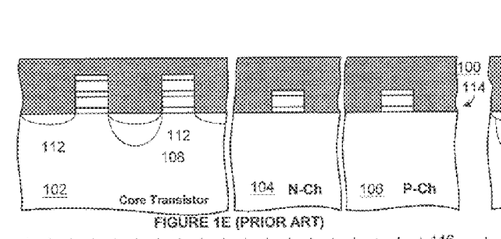

FIG. 1E shows the portion 100 of the partially completed semiconductor wafer as shown in FIG. 1D with a layer 114 of photoresist formed on the wafer.

Figure 2E:
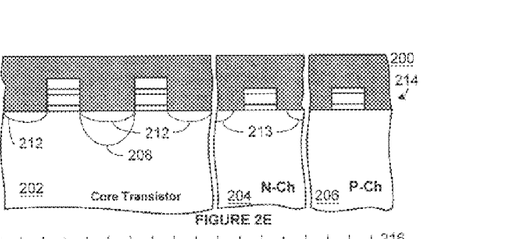

FIG. 2E shows the portion 200 of the partially completed semiconductor wafer as shown in FIG. 2D with a layer 214 of photoresist formed on the wafer.

Figure 1F:
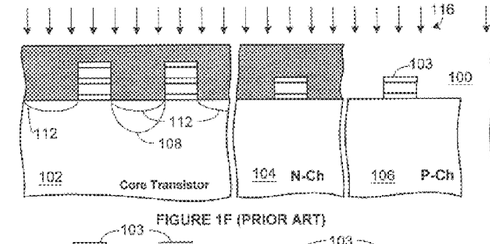

FIG 1F shows the portion 100 of the partially completed semiconductor wafer as shown in FIG. 1E with a portion of the layer 114 of photoresist removed from over the p-channel region 106 and the wafer being implanted with a PLdd (p-type dopant forming a lightly doped drain [and/a source] region) implant indicated by the arrows 116.

Figure 2F:
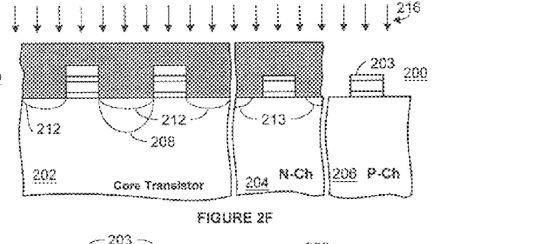

FIG. 2F shows the portion 200 of the partially completed semiconductor wafer as shown in FIG. 2E with the portion of the layer 214 of photoresist removed from over the p-channel region 206 and the wafer being implanted with a PLdd implant indicated by the arrows 216.

Figure 1G:
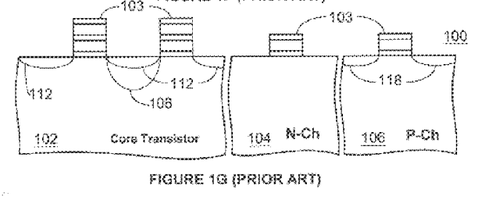

FIG. 1G shows the portion 100 of the partially completed semiconductor wafer as shown in FIG. 1F with the remaining portions of the layer 114 of photoresist removed from the wafer and with PLdd regions 118 formed in the p-channel region 106.

Figure 2G:
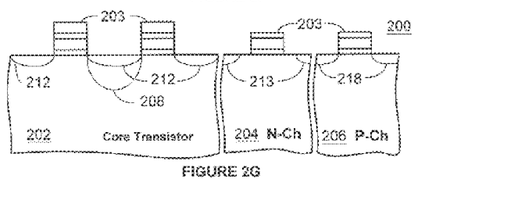

FIG. 2G shows the portion 200 of the partially completed semiconductor wafer as shown in FIG. 2F with the remaining portions of the layer 214 of photoresist removed from the wafer and with PLdd regions 218 formed in the p-channel region 206.

Figure 1H:
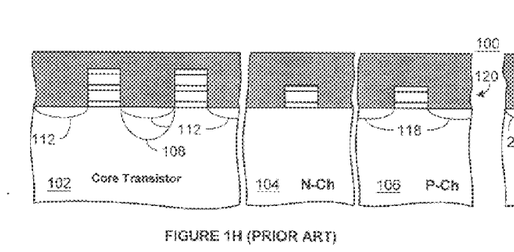

FIG. 1H shows the portion 100 of the partially completed semiconductor wafer as shown in FIG. 1G with a layer 120 of photoresist formed on the wafer.

Figure 2H:
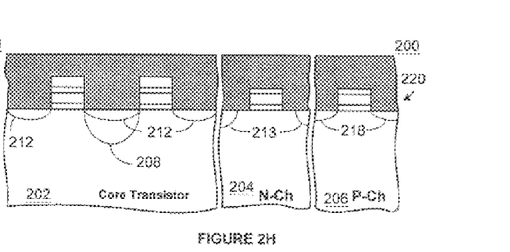

FIG. 2H shows the portion 200 of the partially completed semiconductor wafer as shown in FIG. 2G with a layer 220 of photoresist formed on the wafer.

Figure 1I:
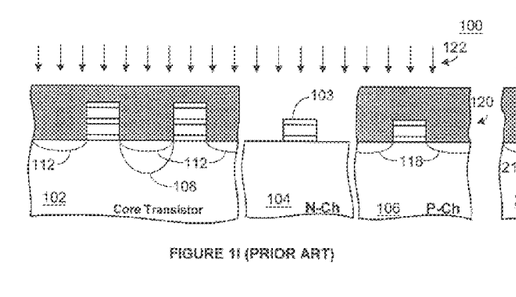

FIG. 1I shows the portion 100 of the partially completed semiconductor wafer as shown in FIG. 1H with the portion of the layer 120 of photoresist removed from over the n-channel region 104 and the wafer being implanted with an NLdd (n-type dopant forming a lightly doped drain [and/or source] region) implant as indicated by arrows 122.

Figure 2I:
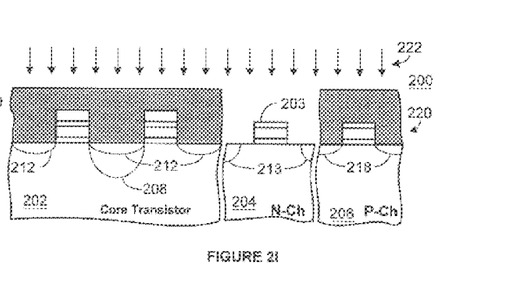

FIG. 2I shows the portion 200 of the partially completed semiconductor wafer as shown in FIG. 2H with the portion of the layer 220 of photoresist removed from over the n-channel region 204 and the wafer being implanted with an NLdd implant as indicated by arrows 222.

Figure 1J:
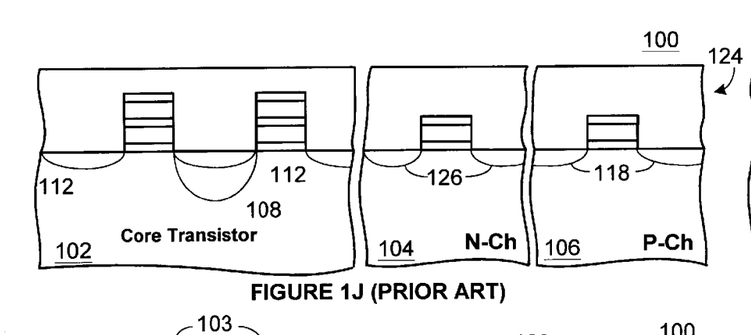

FIG. 1J shows the portion 100 of the partially completed semiconductor wafer as shown in FIG. 1I with a layer 124 of spacer oxide deposited on the wafer and NLdd regions 126 formed in the n-channel region 104.

Figure 2J:
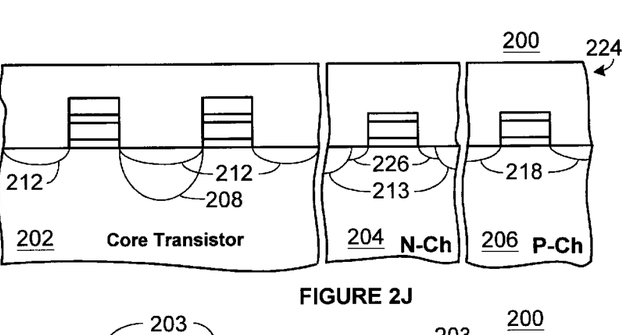

FIG. 2J shows the portion 200 of the partially completed semiconductor wafer as shown in FIG. 2I with a layer 224 of spacer oxide deposited on the wafer and NLdd regions 226 formed in the n-channel region 204.

Figure 1K:
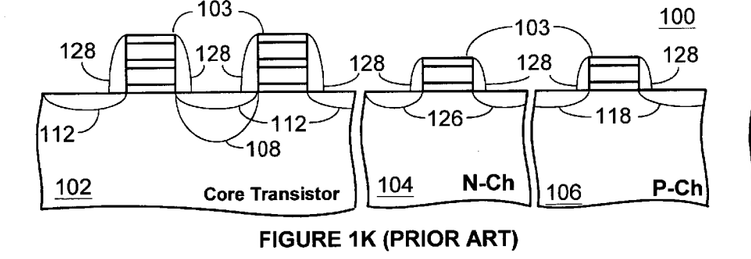

FIG. 1K shows the portion 100 of the partially completed semiconductor wafer as shown in FIG. 1J with the layer 124 of spacer oxide etched to form sidewall spacers 128.

Figure 2K:
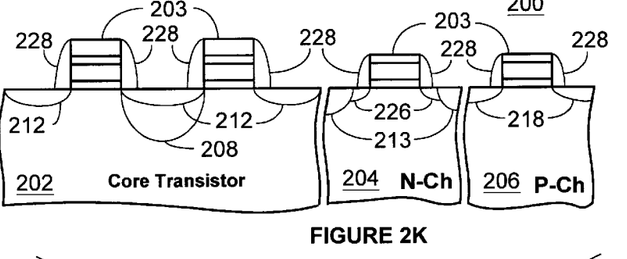

FIG. 2K shows the portion 200 of the partially completed semiconductor wafer as shown in FIG. 2J with the layer 224 of spacer oxide etched to form sidewall spacers 228.

Figure 1L:
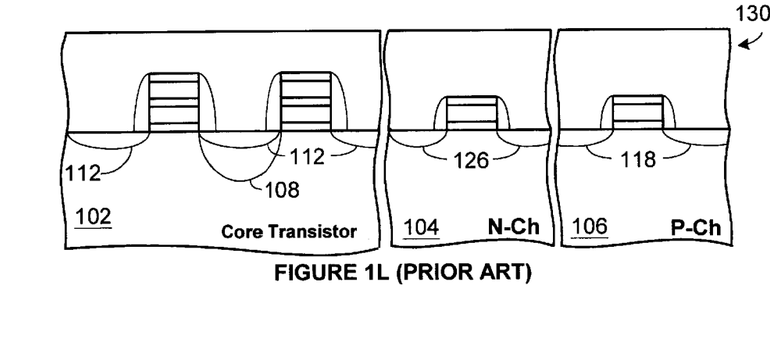

FIG. 1L shows the portion 100 of the partially completed semiconductor wafer as shown in FIG. 1K with a layer 130 of photoresist formed on the wafer.

Figure 1M:
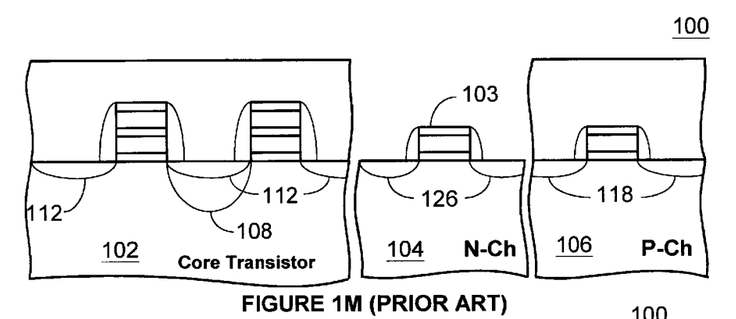
Figure 2L:
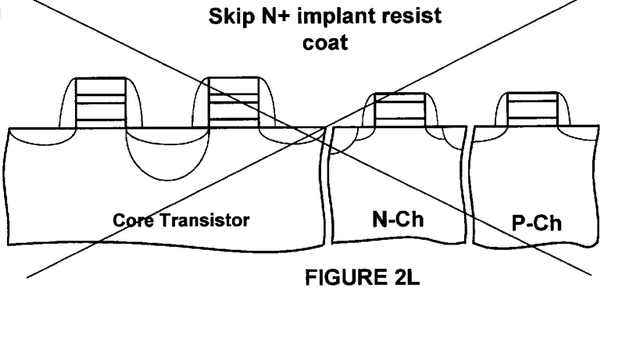

FIG. 2L indicates that the step equivalent to the step shown in FIG. 1L in the prior art can be skipped in the method taught by the present invention. FIG. 1M shows the portion 100 of the partially completed semiconductor wafer as shown in FIG. 1L with the portion of the layer 130 of photoresist over the n-channel region 104 removed.

Figure 2M:
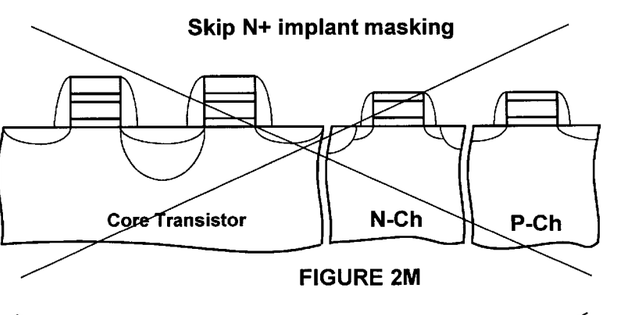

FIG. 2M indicates that the step equivalent to the step shown in FIG. 1M in the prior art can be skipped in the method taught by the present invention.

Figure 1N:
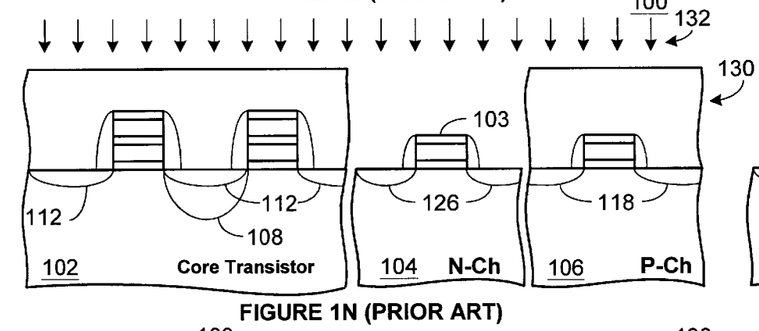

FIG. 1N shows the portion 100 of the partially completed semiconductor wafer as shown in FIG. 1M being implanted with an $N^+$ implant.

Figure 2N:
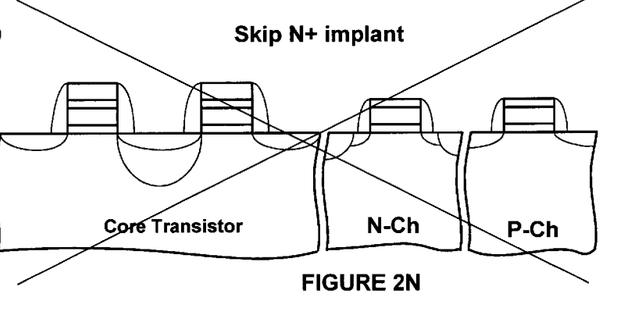

FIG. 2N indicates that the step equivalent to the step shown in FIG. 1N in the prior art can be skipped in the method taught by the present invention.

Figure 1O:
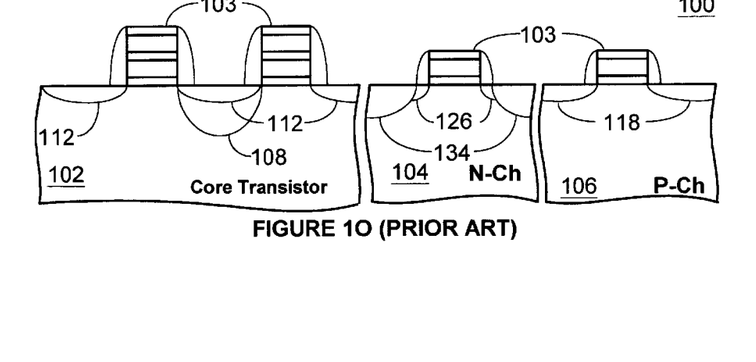

FIG. 1O shows the portion 100 of the partially completed semiconductor wafer as shown in FIG. 1N with the remaining portions of the layer 130 of resist removed and showing the $N^+$ diffusion regions 134 formed in the n-channel 104 region.

Figure 2O:
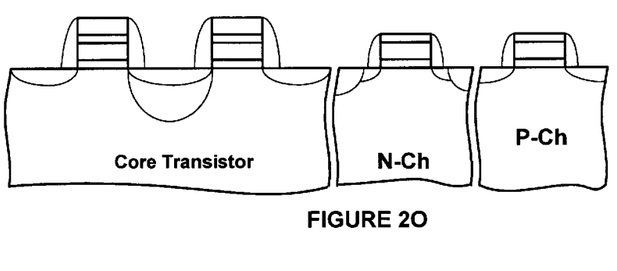

FIG. 2O indicates that the step equivalent to the step shown in FIG. 1O in the prior art can be skipped in the method taught by the present invention.

Figure 1P:
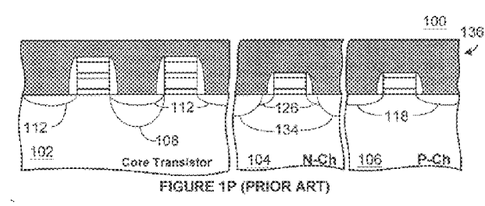

FIG. 1P shows the portion 100 of the partially completed semiconductor wafer as shown in FIG. 1O with a layer 136 of photoresist formed on the wafer.

Figure 2P:
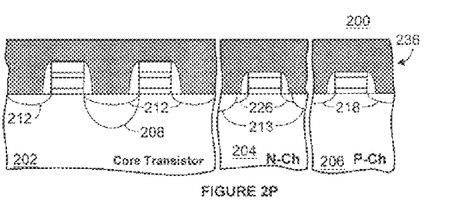

FIG. 2P shows the portion 200 of the partially completed semiconductor wafer as shown in FIG. 2K with a layer 236 of photoresist formed on the wafer.

Figure 1Q:
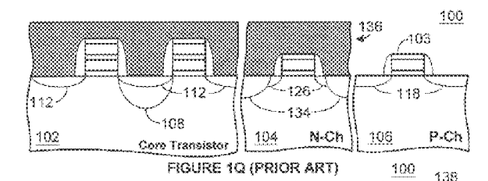

FIG. 1Q shows the portion 100 of the partially completed semiconductor wafer as shown in FIG. 1P with the portion of the layer 136 of photoresist removed from over the p-channel region 106.

Figure 2Q:
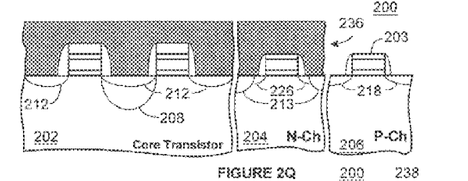

FIG. 2Q shows the portion 200 of the partially completed semiconductor wafer as shown in FIG. 2P with the portion of the layer 236 of photoresist removed from over the p-channel region 206.

Figure 1R:
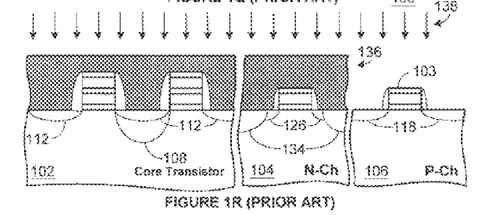

FIG. 1R shows the portion 100 of the partially completed semiconductor wafer as shown in FIG. 1Q being implanted with a $P^+$ implant.

Figure 2R:
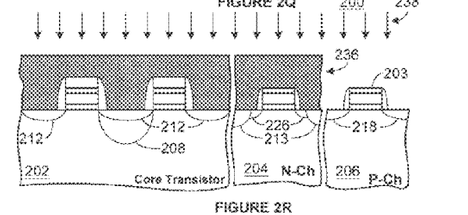

FIG. 2R shows the portion 200 of the partially completed semiconductor wafer as shown in FIG. 2Q being implanted with a $P^+$ implant.

Figure 1S:
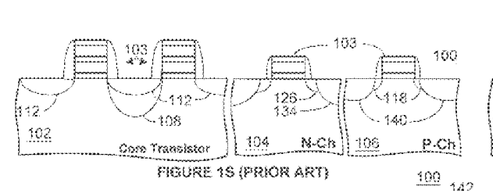

FIG. 1S shows the portion 100 of the partially completed semiconductor wafer as shown in FIG. 1R with the remaining portions of the layer 136 of photoresist removed from the wafer. The implants are driven into the substrate by an S/D (source/drain) oxidation process.

Figure 2S:
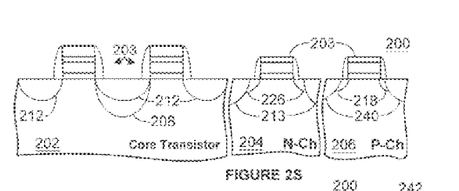

FIG. 2S shows the portion 200 of the partially completed semiconductor wafer as shown in FIG. 2R with the remaining portions of the layer 236 of photoresist removed from the wafer. The implants are driven into the substrate by an S/D oxidation process.

Figure 1T:
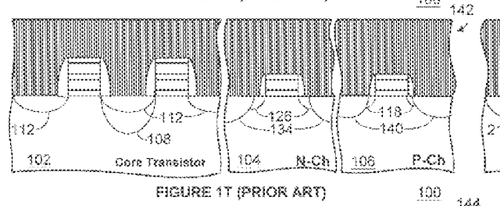

FIG. 1T shows the portion 100 of the partially completed semiconductor wafer as shown in FIG. 1S with a layer 142 of an interlayer oxide, such as BPTeos, formed on the surface of the wafer.

Figure 2T:
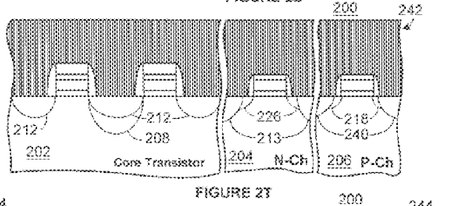

FIG. 2T shows the portion 200 of the partially completed semiconductor wafer as shown in FIG. 2S with a layer 242 of an interlayer oxide, such as BPTeos, formed on the surface of the wafer.

Figure 1U:
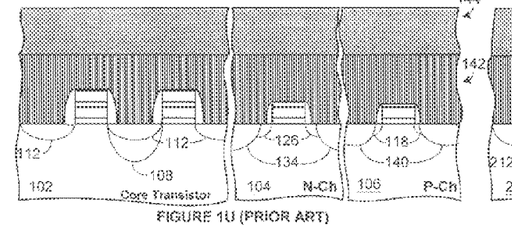

FIG. 1U shows the portion 100 of the partially completed semiconductor wafer as shown in FIG. 1T with a layer 144 of photoresist forming a contact mask on the surface of the layer 142 of interlayer oxide.

Figure 2U:
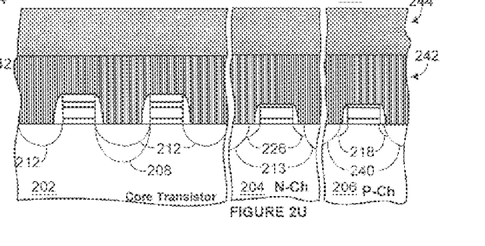

FIG. 2U shows the portion 200 of the partially completed semiconductor wafer as shown in FIG. 2T with a layer 244 of photoresist forming a contact mask on the surface of the layer 242 of interlayer oxide.

Figure 1V:
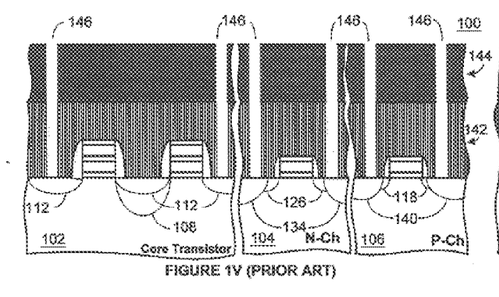

FIG. 1V shows the portion 100 of the partially completed semiconductor wafer as shown in FIG. 1U with the layer 144 of photoresist patterned to enable holes 146 to be cut in the layer 142 of interlayer oxide to permit the formation of electrical contacts with electrodes in the underlying transistors.

Figure 2V:
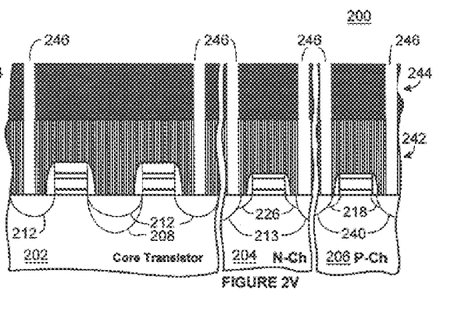

FIG. 2V shows the portion 200 of the partially completed semiconductor wafer as shown in FIG. 2U with the layer 244 of photoresist patterned to enable holes 246 to be cut in the layer 242 of interlayer oxide to permit the formation of electrical contacts with electrodes in the underlying transistors.

Figure 1W:
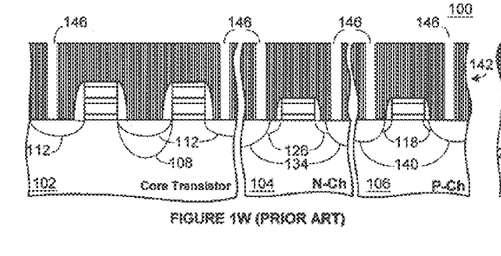

FIG. 1W shows the portion 100 of the partially completed semiconductor wafer as shown in FIG. 1V with the layer 144 of photoresist removed from the wafer.

Figure 2W:
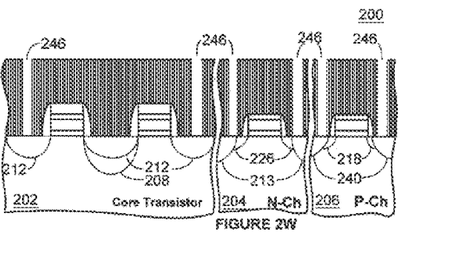

FIG. 2W shows the portion 200 of the partially completed semiconductor wafer as shown in FIG. 2V with the layer 244 of photoresist removed from the wafer.

Figure 1X:
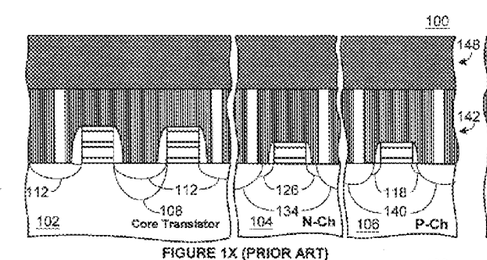

FIG. 1X shows the portion 100 of the partially completed semiconductor wafer as shown in FIG. 1W with a layer 148 of photoresist formed on the surface of the layer 142 of interlayer oxide.

Figure 2X:
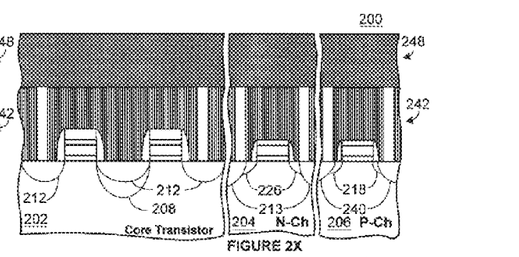

FIG. 2X shows the portion 200 of the partially completed semiconductor wafer as shown in FIG. 2W with a layer 248 of photoresist formed on the surface of the layer 242 of interlayer oxide.

Figure 1Y:
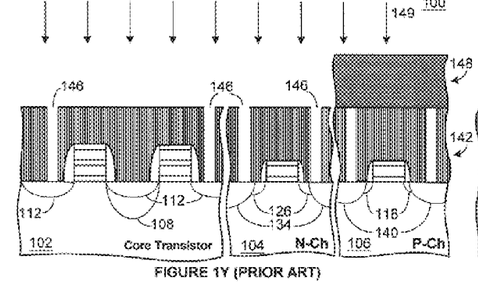

FIG. 1Y shows the portion 100 of the partially completed semiconductor wafer as shown in FIG. 1X with portions of the layer 148 of photoresist over the core transistor 102 region and n-channel 104 region removed and with the $N^+$ contact implant being implanted indicated by arrows 149.

Figure 2Y:
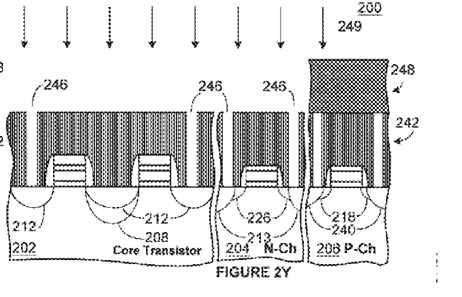

FIG. 2Y shows the portion 200 of the partially completed semiconductor wafer as shown in FIG. 2X with portions of the layer 248 of photoresist over the core transistor 202 region and n-channel 104 region removed and with the $N^+$ contact implant being implanted indicated by arrows 249.

Figure 1Z:
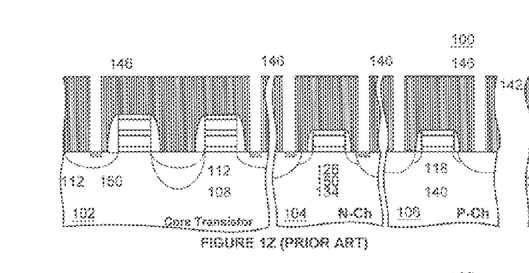

FIG. 1Z shows the portion 100 of the partially completed semiconductor wafer as shown in FIG. 1Y with the remaining portions of the layer 148 removed and showing the $N^+$ contacts 150.

Figure 2Z:
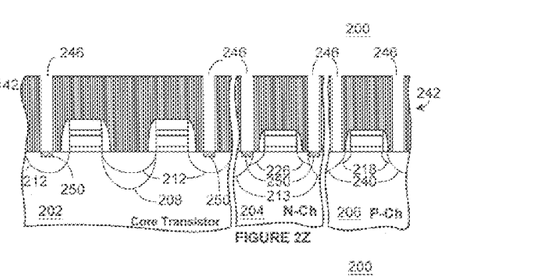

FIG. 2Z shows the portion 200 of the partially completed semiconductor wafer as shown in FIG. 2Y with the remaining portions of the layer 248 of photoresist removed and showing the $N^+$ contacts 250.

FIG. 1AA shows the portion 100 of the partially completed semiconductor wafer as shown in FIG. 1Z with a layer 152 of photoresist formed on the layer 142 of interlayer oxide.

FIG. 2AA shows the portion 200 of the partially completed semiconductor wafer as shown in FIG. 2Z with a layer 252 of photoresist formed on the layer 242 of interlayer oxide.

FIG. 1AB shows the portion 100 of the partially completed semiconductor wafer as shown in FIG. 1AA with a portion of the layer 152 of photoresist removed from over the p-channel region 106.

FIG. 2AB shows the portion 200 of the partially completed semiconductor wafer as shown in FIG. 2AA with a portion of the layer 252 of photoresist removed from over the p-channel region 206.

FIG. 1AC shows the portion 100 of the partially completed semiconductor wafer as shown in FIG. 1AB being implanted with $P^+$ contact implants indicated by arrows 154.

FIG. 2AC shows the portion 200 of the partially completed semiconductor wafer as shown in FIG. 2AB being implanted with $P^+$ contact implants indicated by arrows 254.

FIG. 1AD shows the portion 100 of the partially completed semiconductor wafer as shown in FIG. 1AC with the remaining portions of the layer 152 of photoresist removed and showing the $P^+$ contacts 156 and with the wafer being ready for contact plug and metal.

FIG. 2AD shows the portion 200 of the partially completed semiconductor wafer as shown in FIG. 2AB with the remaining portions of the layer 252 of photoresist removed and showing the $P^+$ contacts 256 and with the wafer being ready for contact plug and metal.

Figure 3:
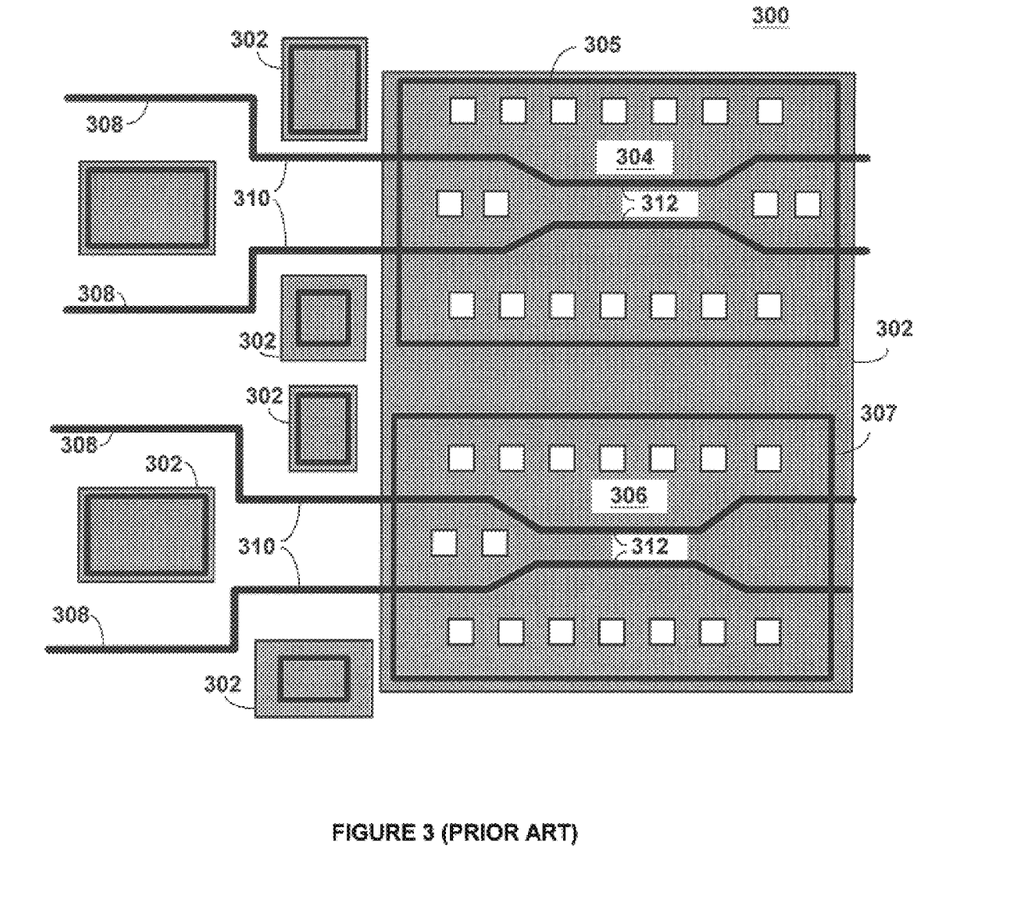
FIG. 3 shows a prior art transistor layout for N+ and P+ implants.

FIG. 3 shows a portion 300 of a transistor layout in accordance with prior art implant areas, indicated by the shaded areas 302, that cover the active area 304 delineated by line 305 and active area 306 delineated by line 307 and other diffusion areas that are to be implanted with $N^+$ and/or $P^+$ implants. The other diffusion areas are structures well known in the art, such as guard ring structures and will not be discussed. The lines 308 are polysilicon (Poly II) structures with portions 310 acting as interconnects and portions 312 acting as gates for transistors constructed in the active areas 304 and 306.

Figure 4:
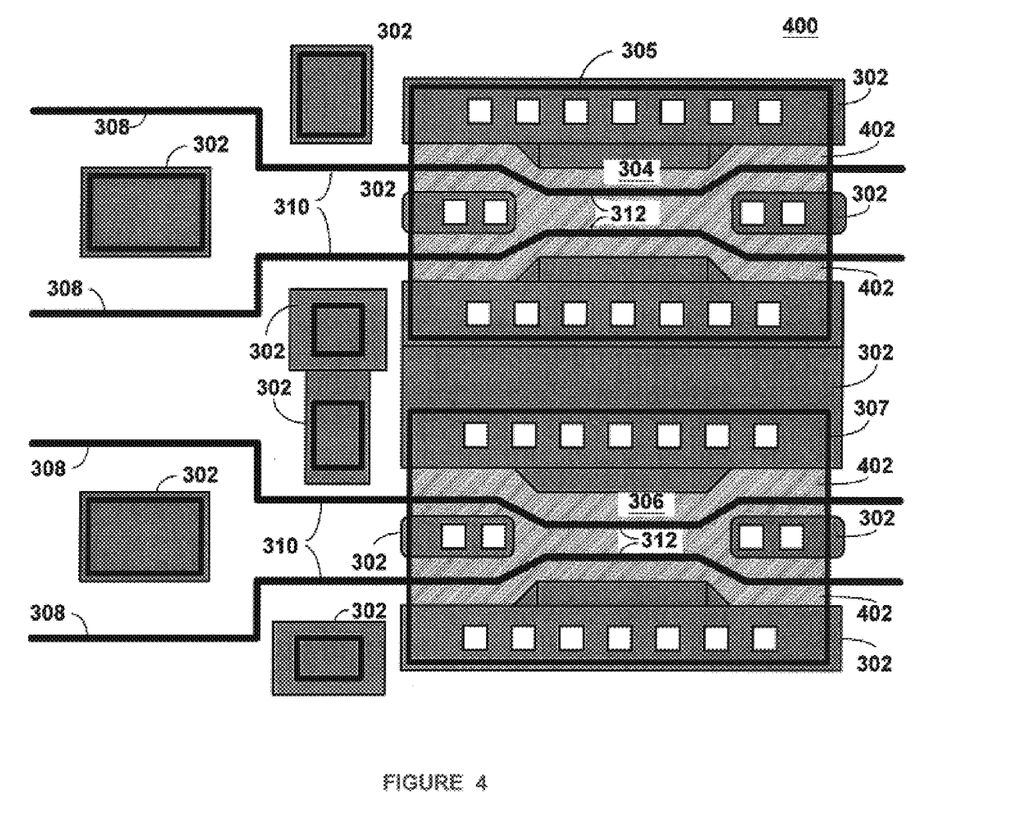
FIG. 4 shows the transistor layout with a resist spacer for an Mdd implant that replaces the N+ implant in accordance with the present invention.

FIG. 4 shows the portion 300 of the transistor layout as shown in FIG. 3 with implant areas in accordance with the present invention and where like numerals represent like elements. Cross-hatched areas 402 show the layout of the resist spacer formed on the n-channel (See FIG. 2B) for the subsequent Mdd implant (See FIG. 2C). The Mdd implant therefore is into areas within the lines 305 and 307 that are not protected by the resist spacer 402.

In summary, the present invention overcomes the limitations of the prior art and provides a method for the manufacture of semiconductor memory devices that reduces the number of manufacturing steps necessary to manufacture the semiconductor devices resulting in a reduction of the cost of producing the semiconductor memory devices.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing flash technology semiconductor devices that replaces the $N^+$ implant with a standard medium doped drain (Mdd) implant, the method comprising:

(a) forming gate structures on a semiconductor substrate in regions in which core transistors, n-channel transistors and p-channel transistors will be formed;

(b) forming a layer of photoresist material on the semiconductor substrate;

(c) removing the layer of photoresist material from the core transistor region;

(d) forming resist spacers from the photoresist material on the n-channel gate structures;

(e) implanting the core transistor regions and portions of the n-channel regions unprotected by the resist spacers with an Mdd implant;

(f) implanting the p-channel transistors with a PLdd implant;

(g) implanting the n-channel transistors with an NLdd implant;

(h) forming sidewall spacers on the gate structures;

(i) implanting the p-channel transistors with a $P^+$ implant;

(j) forming $N^+$ contacts; and (k) forming $P^+$ contacts.

2. The method of claim 1 wherein step (d) is accomplished by forming a photoresist pattern having a dimension of G+2S, wherein G is the dimension of the gate formed on the substrate on which n-channel transistor will be formed and S is the dimension of the resist spacers formed on each side of the n-channel gate.

* * * * *